(12) United States Patent
Brandenburg et al.

(10) Patent No.: US 8,797,739 B2
(45) Date of Patent: Aug. 5, 2014

(54) SELF CIRCULATING HEAT EXCHANGER

(75) Inventors: Scott D. Brandenburg, Kokomo, IN (US); Suresh K. Chengalva, Westfield, IN (US)

(73) Assignee: Delphi Technologies, Inc., Troy, MI (US)

( * ) Notice: Subject to any disclaimer, the term of this patent is extended or adjusted under 35 U.S.C. 154(b) by 190 days.

(21) Appl. No.: 13/525,423

(22) Filed: Jun. 18, 2012

(65) Prior Publication Data

US 2012/0325441 A1   Dec. 27, 2012

Related U.S. Application Data

(60) Provisional application No. 61/500,235, filed on Jun. 23, 2011.

(51) Int. Cl.
*H05K 7/20* (2006.01)

(52) U.S. Cl.
USPC ...... 361/699; 361/679.53; 361/698; 361/700; 361/714; 165/80.4; 165/80.5; 165/104.33

(58) Field of Classification Search
USPC .......... 361/679.46, 679.48, 679.53, 688, 689, 361/698, 699, 714, 715, 719–724; 165/80.2, 80.4, 80.5, 104.21, 104, 26, 165/104.27, 104.29, 104.33, 185; 62/259.2; 257/714, 715, 722; 174/15.1, 16.3
See application file for complete search history.

(56) References Cited

U.S. PATENT DOCUMENTS

| | | | | |
|---|---|---|---|---|
| 3,270,250 | A * | 8/1966 | Davis | 361/700 |
| 3,851,221 | A * | 11/1974 | Beaulieu et al. | 361/679.31 |
| 4,027,728 | A * | 6/1977 | Kobayashi et al. | 165/104.27 |
| 4,312,012 | A * | 1/1982 | Frieser et al. | 257/713 |
| 4,572,286 | A * | 2/1986 | Fujii et al. | 165/104.29 |
| 4,694,323 | A * | 9/1987 | Itahana et al. | 257/715 |
| 4,704,658 | A * | 11/1987 | Yokouchi et al. | 361/698 |
| 4,949,164 | A * | 8/1990 | Ohashi et al. | 257/715 |
| 6,176,098 | B1 * | 1/2001 | Moriguchi | 62/259.2 |
| 6,698,503 | B2 * | 3/2004 | Son et al. | 165/104.26 |

\* cited by examiner

*Primary Examiner* — Michail V Datskovskiy
(74) *Attorney, Agent, or Firm* — Lawrence D. Hazelton

(57) ABSTRACT

A self-circulating heat exchanger apparatus for dissipating heat from an electronic assembly. An enclosure defines a closed-loop circulation path for coolant. An electronic assembly capable of generating heat is installed into a vertical portion of the enclosure such that heat from the electronic assembly causes coolant in the vertical portion to rise, thereby inducing self-circulation of the coolant in the enclosure. The electronic assembly is coated with a combination of silicon nitride and PARYLENE® in order to protect electronic components from water based coolants such as a mixture of ethylene glycol and water.

13 Claims, 3 Drawing Sheets

SELF CIRCULATING HEAT EXCHANGER

CROSS-REFERENCE TO RELATED APPLICATION

This application claims the benefit under 35 U.S.C. §119 (e) of U.S. Provisional Patent Application No. 61/500,235, filed Jun. 23, 2011, the entire disclosure of which is hereby incorporated herein by reference.

TECHNICAL FIELD OF INVENTION

This disclosure generally relates to a self-circulating heat exchanger, and more particularly relates to an electronic assembly with a coating that allows a water-based coolant to be used in the self-circulating heat exchanger.

BACKGROUND OF INVENTION

There is a continuing desire to increase the power dissipating capabilities of electronics used in applications such as photo-voltaic (PV) based power generation and hybrid vehicle electrical power management. Various arrangements for liquid cooling of electronics have been proposed. Dielectric fluids that are highly electrically resistive are available, but the thermal characteristics of these dielectric fluids (e.g.—thermal conductivity, heat transfer coefficient, and specific heat) are much poorer than water based coolants (e.g. mixtures of water and ethylene glycol) characteristics. Furthermore, the cost of dielectric fluids are undesirable high when compared to water based coolants. However, a water based coolant may have a less than desirable electrical resistivity, and so special electronics packaging precautions are often necessary to avoid electrical interference and contamination problems that may arise as the result of using water based coolants. In general, the packaging precautions taken when using water based coolant tend to increase thermal resistance between the source of heat and the coolant. Furthermore, it is desirable to avoid the added complexity and cost associated with providing a pumping mechanism if circulation of the coolant is required to meet desired power dissipation levels.

SUMMARY OF THE INVENTION

In accordance with one embodiment, a self-circulating heat exchanger apparatus for dissipating heat from an electronic assembly is provided. The apparatus includes an enclosure and an electronic assembly. The enclosure is configured to define a closed-loop circulation path for coolant. The path includes a vertical portion. The electronic assembly is capable of generating heat. The electronic assembly is installed into the enclosure proximate to the vertical portion such that heat from the electronic assembly causes coolant in the vertical portion to rise, thereby inducing self-circulation of the coolant in the enclosure.

In another embodiment, an immersable electronic assembly suitable for immersion in water based coolant is provided. The assembly includes an electronic component, a first heat spreader, a second heat spreader, and a dielectric layer. The electronic component defines a first surface and a second surface opposite the first surface. The first heat spreader defines a contact surface of the first heat spreader that is electro-mechanically attached to the first surface. The second heat spreader that defines a contact surface of the second heat spreader that is electro-mechanically attached to the second surface. The dielectric layer is formed of silicon nitride configured to protect the electronic component, the first heat spreader, and the second heat spreader.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
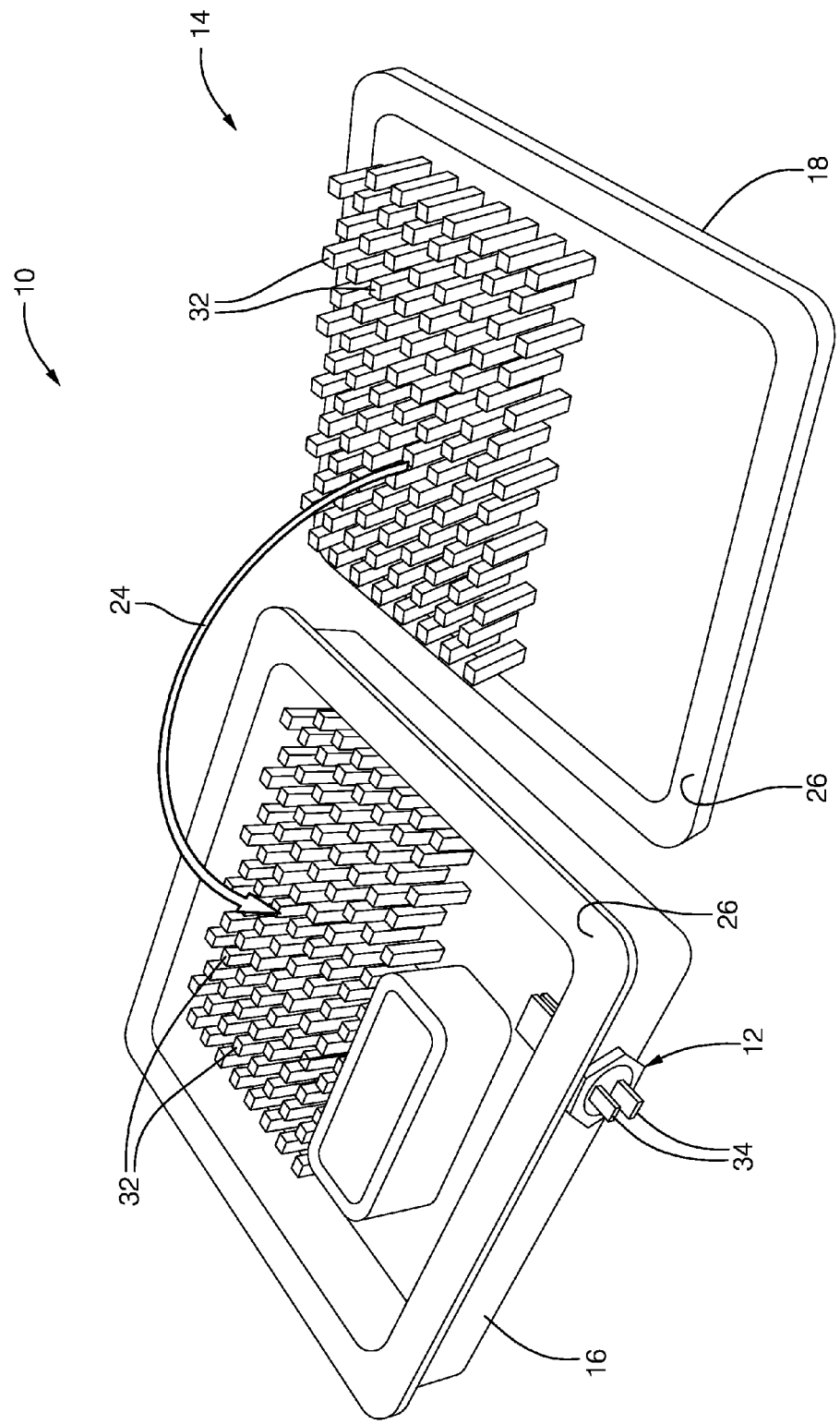
FIG. 1 is an exploded view of a self-circulating heat exchanger apparatus in accordance with one embodiment.

FIG. 1 illustrates a partially disassembled, non-limiting example of a self-circulating heat exchanger apparatus, hereafter the apparatus 10. In general, the apparatus 10 is for dissipating heat from an electronic assembly 12. The apparatus includes an enclosure 14 formed when a housing 16 and a cover 18 are assembled. The housing 16 and cover 18 are preferably formed of a thermally conductive material such as aluminum or a thermally conductive plastic. In general, the enclosure 14 is configured to contain coolant within the enclosure 14 when the cover 18 is assembled to housing 16 as suggested by arrow 24. As such, a fluid tight seal is generally formed between the housing 16 and the cover 18 along the sealing surfaces 26. The fluid tight seal may be formed by welding, applying an adhesive on one or both of the sealing surfaces 26.

The electronic assembly 12 is coupled to the housing 16 in a manner that preferably forms a fluid tight seal. By way of example and not limitation, the electronic assembly 12 and the housing 16 may include cooperating threaded portions (not shown) to facilitate installing the electronic assembly into the housing 16, and sealing of the threaded portions may be by way of an O-ring, adhesive, or tape as is known in the art. The electronic assembly 12 may include one or more terminals 34 protruding from the electronic assembly 12, or other known features to facilitate making an electrical connection to the electronic assembly 12.

Figure 2:
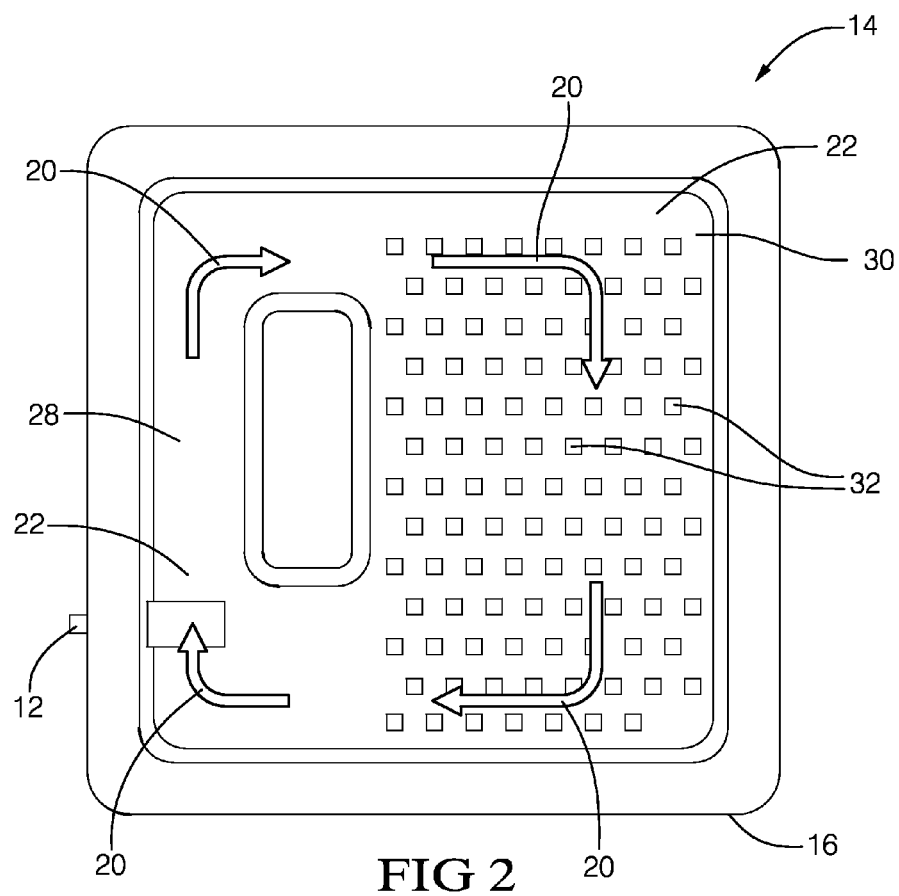
FIG. 2 is a cut-away side view of the apparatus of FIG. 1 in accordance with one embodiment.

FIG. 2 further illustrates the non-limiting example of FIG. 1 by showing a sectional side view of corresponding to the enclosure 14 with the cover 18 removed, i.e. the housing 16 with the electronic assembly installed. The enclosure 14 is generally configured to define a closed-loop circulation path, hereafter the path 20, for coolant 22. A suitable coolant is a mixture of water and ethylene glycol (WEG) mixed at a ratio of, for example, one-to-one. WEG is advantageous because it is less expensive and in general has more desirable thermal properties for removing heat from the electronic assembly 12 than available dielectric fluids commonly used for liquid cooling electronics. However, it is recognized that the electrically conductive nature of WEG may be problematic for some electronic packaging strategies, especially in instances where the coolant 22 is in intimate contact with a semiconductor device or electronic component 40 (FIG. 3) such as a diode, transistor, or integrated circuit in die form. Accordingly, a way to package such an electronic component that minimizes thermal resistance between the electronic component 40 and the coolant 22 is described elsewhere herein.

As will become apparent in the description that follows, the apparatus 10 advantageously exhibits a self-circulation effect. While not subscribing to any particular theory, the observed self-circulation effect appears to be by way of induced convection circulation of the coolant 22 present in the path 20, and the self-circulation generally increases heat transfer from the electronic assembly 12. It should be appreciated that the path 20 includes a vertical portion 28 that forms a confined region where the coolant 22 heated by the electronic assembly 12 rises, and so is replaced by coolant 22 received from a cooling region 30. It should be further appreciated that the self-circulation effect will be generally most evident when the enclosure 14 is oriented as illustrated in FIG. 2 so the coolant 22 can rise vertically in the vertical portion 28. The self-circulation effect may be diminished if the vertical portion 28 of the enclosure 14 is oriented otherwise such as the orientation suggested in FIG. 1. It is recognized that the flow direction would be reversed if the apparatus 10 were turned upside down.

In general, the electronic assembly 12 is located in the enclosure 14 such that the electronic assembly 12, at least the heat generating portion of the electronic assembly, is substantially immersed in coolant 22 when installed onto the enclosure 14. In one embodiment, the enclosure 14 is substantially filled with the coolant 22. As such, substantially all the path 20 is occupied with liquid, and the coolant 22 circulates to help remove heat from the electronic assembly 12. This kind of liquid only cooling condition is sometimes referred to as single phase cooling because the coolant 22 generally does not change from the liquid state. Alternatively, the enclosure 14 may be partially full so that the electronic assembly 12 is substantially immersed in the coolant, but the apparatus 10 is configured so that the coolant 22 is 'boiled' by the electronic assembly 12, and so heat is carried away from the electronic assembly 12 by way of a so-called two-phase cooling mechanism. In this instance, gaseous coolant or liquid vapor phase coolant may rapidly rise along an upper portion of the path 20, and condense back into a liquid state in the cooling region 30.

Referring again to FIG. 1, the enclosure 14 may include fins 32. In this non-limiting example, the fins 32 are illustrated extending from both the housing 16 and the cover 18. When the enclosure 14 is assembled, the fins 32 may be arrange to intermingle, or may be arranged to line up end to end, possibly making contact at the end of each opposed fin. Such a configuration is advantageous over configuration with fins only on the housing 16 or only on the cover 18 as heat is conducted more uniformly to the outer surfaces of the housing. As such, the path 20 is configured to transfer heat from the coolant 22 to outside the enclosure 14. It is recognized that there is a wide variety of fin configurations that may be suitable for use inside the enclosure 14, and that the exterior of the enclosure 14 may also include fins or other features (not shown) to increase the effective surface area of the exterior and thereby further improve heat dissipation.

Figure 3:
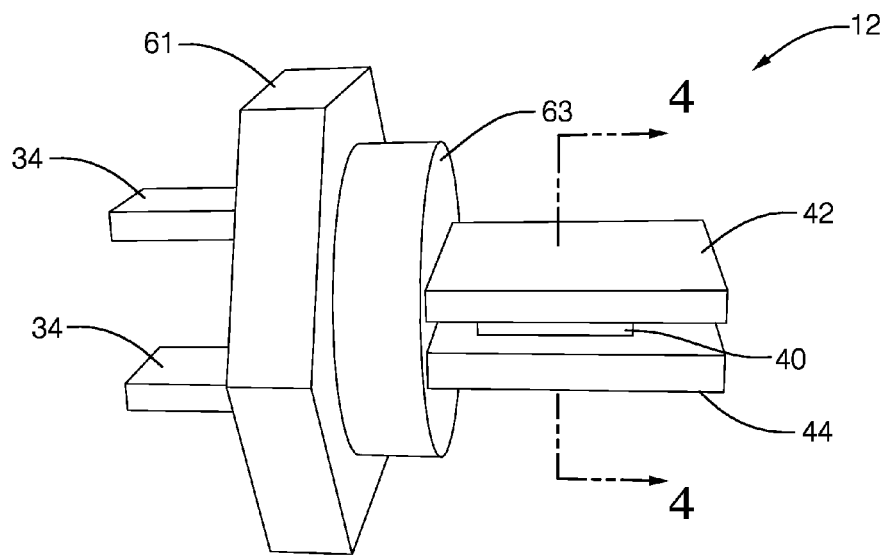
FIG. 3 is perspective view of an electronic assembly used in the apparatus of FIG. 1 in accordance with one embodiment.

FIG. 3 further illustrates the non-limiting example of the electronic assembly 12. The electronic assembly 12 includes an electronic component 40 situated between a first heat spreader 42 and a second heat spreader 44. When the electronic assembly 12 is immersed in coolant 22, heat is dissipated into the coolant 22 from both sides of the electronic component 40 via the first heat spreader 42 and the second heat spreader 44. As such, apparatus 10 described herein is advantageous over configurations that have a power device mounted to a heat sink (heat exchanger) so heat is only dissipated in one direction, and the power device is not immersed in cooling fluid. As will be explained in more detail later, the electronic assembly 12 includes a coating applied to an optimized thickness in order to minimizes thermal resistance between the electronic component 40 and the coolant 22, but maximize protection of the electronic assembly 12.

The terminals 34 may each be part of or formed extensions of the first heat spreader 42 and the second heat spreader 44. Once the electronic component 40 is attached to the first heat spreader 42 and the second heat spreader 44, and the terminals 34 are formed, the arranged parts may be installed into a base 61 formed of, for example, brass, and secured to the base 61 using potting compound 63 such as an epoxy or other material known to those in the art.

Figure 4:
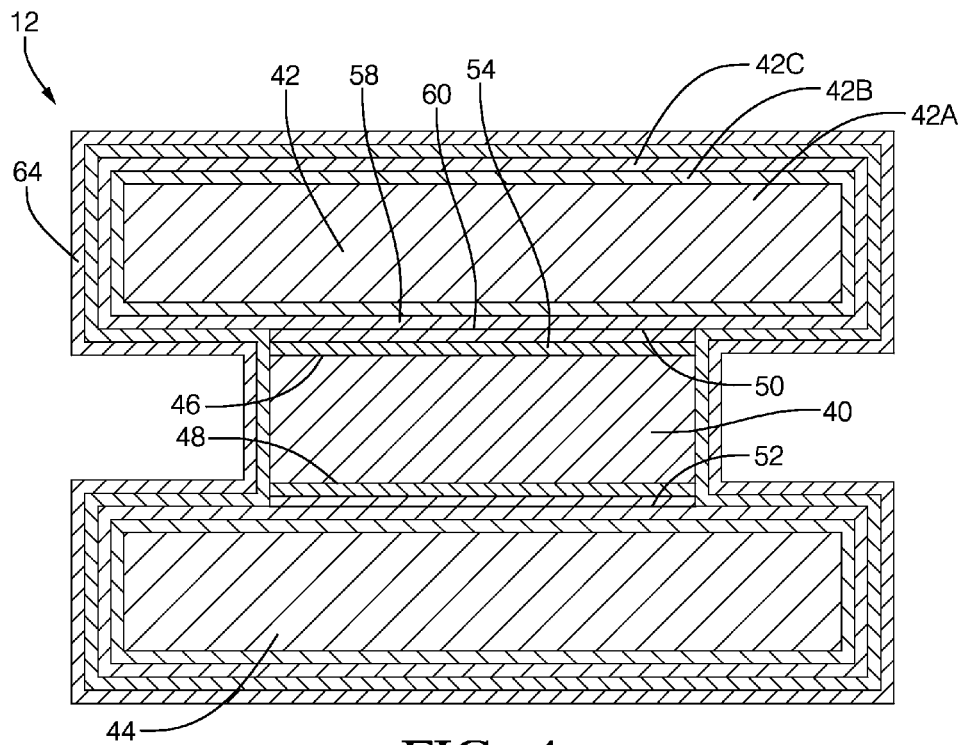
FIG. 4 is a sectional view of the electronic assembly of FIG. 3 in accordance with one embodiment.

FIG. 4 further illustrates details of the electronic assembly 12 by way of a cross section view through the electronic component 40, the first heat spreader 42, and the second heat spreader 44. In general, the electronic component 40 defines a first surface 46 and a second surface 48 opposite the first surface 46. In general, the first surface 46 is electro-mechanically attached to a contact surface 50 of the first heat spreader 42, and the second surface 48 is electro-mechanically attached to a contact surface 52 of the second heat spreader 44. As used herein, electro-mechanically attached means that the electronic component 40 is both electrically connected and mechanically coupled or metallurgically bonded to the first heat spreader 42 and the second heat spreader 44.

In one embodiment, the electronic component 40 is formed predominately of semiconductor material such as silicon or germanium, and so may be or include one or more any of known devices such as a diodes, transistors, or integrated circuits. Alternatively, the electronic component 40 may be formed of a ceramic based material that changes electrical conductivity with temperature and so the electronic component 40 may be a thermistor. While the electronic component 40 is illustrated as a single contiguous part, it is contemplated that multiple parts could be arranged between the first heat spreader 42 and the second heat spreader 44; see FIG. 5. By way of example and not limitation, if the electronic component 40 is a diode the thickness may be about seventy six micrometers (76 um) and have lateral dimensions of equal to or greater than ten millimeters by ten millimeters (10 mm×10 mm). It is also recognized that the package configuration set forth herein may also be used to advantageously package smaller electronic components, for example four millimeters by four millimeters (4 mm×4 mm). While the lateral dimension examples imply that the electronic component 40 is square, rectangle shapes are also contemplated.

The first heat spreader 42 and the second heat spreader 44 may be suitably formed predominately of Molybdenum. Molybdenum may be advantageous because it has a thermal expansion coefficient that is close enough to typical semiconductor materials so that a reliable electro-mechanical bond can be formed with the electronic component 40 while still providing excellent thermal properties for conducting heat. The first heat spreader 42 and/or the second heat spreader 44 may be formed of a copper/molybdenum/copper clad core 42A having a thickness of two hundred fifty micrometers (250 um) to five hundred micrometers (500 um) that is plated with nickel 42B to a thickness of one micrometer (1 um) to two micrometers (2 um), and then plated with tin 42C to a thickness of four micrometers (4 um) to seven micrometers (7 um). By way of further example, the first heat spreader 42 and the second heat spreader 44 may have lateral dimensions of twenty millimeters by twenty millimeter's (20 mm×20 mm). While the lateral dimension examples imply that the first heat spreader 42 and the second heat spreader 44 are square, rectangle shapes are also contemplated.

In one embodiment, the first surface 46 is overlaid by a surface layer 54 formed of a solderable material, for example silver, gold, or palladium, to form a contact surface 56 of the electronic component 40. The first heat spreader 42 includes an interface layer 58 formed of tin 42C as suggested above, or other solderable material. The electronic assembly 12 may include a connection layer 60 for attaching the surface layer 54 to the interface layer 58. The connection layer 60 may be formed preferably of solder, for example eutectic tin-lead solder or a higher melting temperature solder such as tin-silver, or alternatively formed of conductive epoxy or silver based sintering material. The connection layer 60 is preferably fifty micrometers (50 um) to one hundred fifty micrometers (150 um). If the connection layer 60 is too thin, the solder joint formed by the connection layer 60 may be unable to accommodate any thermal expansion mismatch between the first heat spreader 42 and the electronic component 40. If the connection layer 60 is too thick, thermal resistance between the electronic component 40 and the coolant 22 may undesirably increase.

In order to have at least the portion of the electronic assembly 12 that is exposed to the coolant 22 be characterized as immersable, the electronic assembly 12 may be made more reliable by providing a dielectric layer 62 to protect the exposed surface of the electronic component 40, the first heat spreader 42, the second heat spreader 44, and material forming the solder joint such as the connection layer 60. A suitable material for the dielectric layer 62 is silicon nitride having a thickness of six micrometers (6 um) to twenty five micrometers (25 um), preferably twelve micrometers (12 um). Testing indicated that if the dielectric layer 62 was too thin, the risk of pinholes in the dielectric layer 62 was unacceptably high, and if the dielectric layer 62 was too thick, the risk of cracking the dielectric layer was unacceptably high and the thermal resistance of the electronic assembly 12 was undesirably increased. The silicon nitride may be applied using known chemical vapor deposition processes.

The reliability of the electronic assembly 12 may be further improved by applying a protecting layer 64 over the dielectric layer 62 and elsewhere in the electronic assembly 12. A suitable material for the protective layer is PARYLENE® having a thickness of two micrometers (2 um) to twenty micrometers (20 um), preferably five micrometers (5 um). If the protective layer 64 is too thin, the risk of pinholes in the protecting layer 64 is unacceptably high, and if the protective layer 64 it too thick, costs are unnecessarily increased and the thermal resistance of the electronic assembly 12 was undesirably increased. PARYLENE® is generally applied according to the material supplier's recommendations that typically suggest a vapor deposition type process. To prevent coating the metal heat sink that is used for electrical connection, areas of the heat sink are masked with polyimide (tape or similar) prior to the SiN and Paralyne CVD coating processes.

Figure 5:
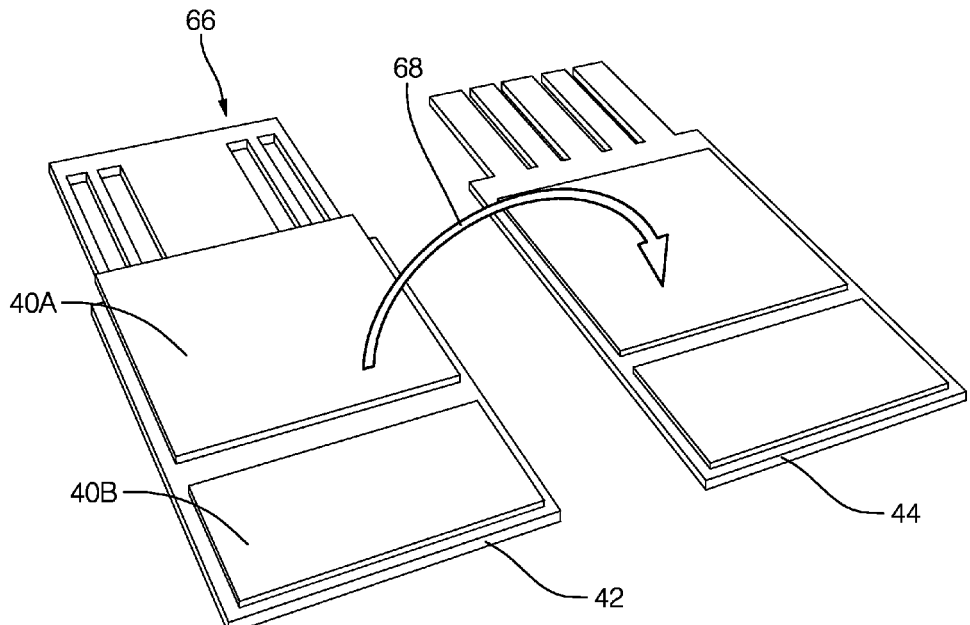
FIG. 5 is an exploded view of part of an electronic assembly of FIG. 3 in accordance with one embodiment.

FIG. 5 illustrates alternative non-limiting example of electronic components 40A and 40B arranged on the first heat spreader 42 prior to being arranged with the second heat spreader 44 as suggested by arrow 68. The first heat spreader 44 is configured to provide multiple connections to the electronic component 40A. It should be recognized that an end portion 66 of the first heat spreader 42 would be cut off after assembly to the base 61 (FIG. 3) so that multiple isolated electrical connections to the electronic component 40A are formed. As such, electrical components with more than two connections, such as transistors and integrated circuits, can be used in the electronic assembly 12.

Accordingly, a self-circulating heat exchanger apparatus (the apparatus 10), and an immersable electronic assembly (the electronic assembly 12 is provided. The features of the electronic assembly 12 provide for efficient cooling of an electronic component at a relatively cost while providing high reliability. Coatings applied to the electronic assembly 12 allow for intimate contact with the coolant 22, and allow for an inexpensive mixture of water and ethylene glycol to be used as the coolant 22. The self-circulation feature provide by the configuration of the enclosure 14 improves heat transfer over liquid based cooling systems that do not provide a means to circulate the coolant 22, and avoids the undesirable cost and complication of providing a pump or other mechanical device to circulate the coolant 22.

While this invention has been described in terms of the preferred embodiments thereof, it is not intended to be so limited, but rather only to the extent set forth in the claims that follow.

We claim:

1. A self-circulating heat exchanger apparatus for dissipating heat from an electronic assembly, said apparatus comprising:
   an enclosure configured to define a closed-loop circulation path for coolant, wherein said path includes a vertical portion; and
   an electronic assembly capable of generating heat, wherein said electronic assembly is installed into the enclosure proximate to the vertical portion such that heat from the electronic assembly causes coolant in the vertical portion to rise, thereby inducing self-circulation of the coolant in the enclosure, wherein the electronic assembly comprises an electronic component that defines a first surface and a second surface opposite the first surface, said first surface electro-mechanically attached to a contact surface of a first heat spreader, and said second surface electro-mechanically attached to a contact surface of a second heat spreader, wherein the electronic assembly is installed into the enclosure such that both the first heat spreader and the second heat spreader are exposed to coolant, wherein the first surface includes a surface layer formed of silver, the contact surface of the first heat spreader includes an interface layer formed of nickel, and the electronic component includes a connection layer for attaching the surface layer to the interface layer, said connection layer formed of silver-tin solder.

2. The apparatus in accordance with claim 1, wherein the electronic assembly is located in the enclosure such that the electronic assembly is substantially immersed in coolant when installed onto the enclosure.

3. The apparatus in accordance with claim 1, wherein the apparatus includes coolant formed of a mixture of ethylene glycol and water.

4. The apparatus in accordance with claim 1, wherein the closed loop path includes a cooling portion configured to transfer heat from the coolant to outside the enclosure.

5. The apparatus in accordance with claim 4, wherein the cooling portion includes fins configured to promote heat transfer from the coolant to outside the enclosure.

6. The apparatus in accordance with claim 1, wherein the electronic assembly is installed into the enclosure such that both the first heat spreader and the second heat spreader are exposed to coolant.

7. The apparatus in accordance with claim 1, wherein the first heat spreader defines an exposed surface of the first heat spreader opposite the contact surface of the first heat spreader that includes a dielectric layer of silicon nitride having a thickness of twelve micrometers (12 um).

8. The apparatus in accordance with claim 1, wherein the electronic assembly is coated with a protective layer of PARYLENE® having a thickness of two micrometers (2 um) to twenty micrometers (20 um).

9. An immersable electronic assembly suitable for immersion in water based coolant, said assembly comprising:
- an electronic component that defines a first surface and a second surface opposite the first surface;
- a first heat spreader that defines a contact surface of the first heat spreader that is electro-mechanically attached to the first surface;
- a second heat spreader that defines a contact surface of the second heat spreader that is electro-mechanically attached to the second surface; and
- a dielectric layer formed of silicon nitride configured to protect the electronic component, the first heat spreader, and the second heat spreader.

10. The assembly in accordance with claim 9, wherein the dielectric layer has a thickness of twelve micrometers (12 um).

11. The assembly in accordance with claim 9, wherein the electronic component is formed predominately of semiconductor material, and the first heat spreader is formed predominately of Molybdenum.

12. The assembly in accordance with claim 9, wherein the first surface includes a surface layer formed of silver, the contact surface of the first heat spreader includes an interface layer formed of nickel, and the electronic component includes a connection layer for attaching the surface layer to the interface layer, said connection layer formed of silver-tin solder.

13. The assembly in accordance with claim 9, wherein the electronic assembly is coated with a protective layer of PARYLENE® having a thickness of two micrometers to twenty micrometers.

* * * * *